(12) United States Patent
Ishinari et al.

(10) Patent No.: US 11,592,583 B2
(45) Date of Patent: Feb. 28, 2023

(54) RADIATION IMAGING APPARATUS, RADIATION IMAGING SYSTEM, METHOD OF CONTROLLING RADIATION IMAGING APPARATUS, AND NON-TRANSITORY COMPUTER-READABLE STORAGE MEDIUM

(71) Applicant: CANON KABUSHIKI KAISHA, Tokyo (JP)

(72) Inventors: Yutaka Ishinari, Kanagawa (JP); Tomoyuki Yagi, Tokyo (JP); Yoshiaki Ishii, Kanagawa (JP); Yuki Iwabuchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/145,072

(22) Filed: Jan. 8, 2021

(65) Prior Publication Data
US 2021/0215834 A1 Jul. 15, 2021

(30) Foreign Application Priority Data
Jan. 15, 2020 (JP) .............................. JP2020-004669

(51) Int. Cl.
*G01T 1/17* (2006.01)
*H01L 27/146* (2006.01)
(Continued)

(52) U.S. Cl.
CPC .......... *G01T 1/17* (2013.01); *H01L 27/14609* (2013.01); *H01L 27/14658* (2013.01); *H04N 5/32* (2013.01); *H04N 5/3765* (2013.01)

(58) Field of Classification Search
CPC .......... H04N 5/3765; H04N 5/32; G01T 1/17; H01L 27/14609; H01L 27/14658
See application file for complete search history.

(56) References Cited

U.S. PATENT DOCUMENTS

2009/0201373 A1* 8/2009 Yamaguchi .......... H04N 5/3575
348/180
2015/0192684 A1* 7/2015 Ito .......................... G01T 7/005
250/362
(Continued)

FOREIGN PATENT DOCUMENTS

JP 2011-101693 A 5/2011
JP 2015-198263 A 11/2015

*Primary Examiner* — David P Porta
*Assistant Examiner* — Fani Polyzos Boosalis
(74) *Attorney, Agent, or Firm* — Canon U.S.A., Inc. IP Division

(57) ABSTRACT

A radiation imaging apparatus comprising a pixel array and a readout circuit is provided. The readout circuit includes an integrating amplifier configured to read out a signal from the pixel, a sample-and-hold circuit configured to sample an output from the integrating amplifier, and an A/D convertor configured to perform analog/digital conversion on an output from the sample-and-hold circuit and output the converted output. The apparatus performs first control and second control in parallel in an accumulation period for accumulating the signal in the pixel array. In the first control, the A/D convertor performs an analog/digital conversion operation, and in the second control, the integrating amplifier outputs a reference potential and the A/D convertor is electrically connected to a node configured to output the reference potential of the integrating amplifier.

15 Claims, 7 Drawing Sheets

(51) Int. Cl.
  *H04N 5/32* (2023.01)
  *H04N 5/376* (2011.01)

(56) References Cited

U.S. PATENT DOCUMENTS

2015/0279882 A1  10/2015  Yagi
2016/0021290 A1* 1/2016  Yagi ...................... H04N 5/378
                                                   250/394
2019/0167214 A1* 6/2019  Sawada ................ A61B 6/4233

* cited by examiner

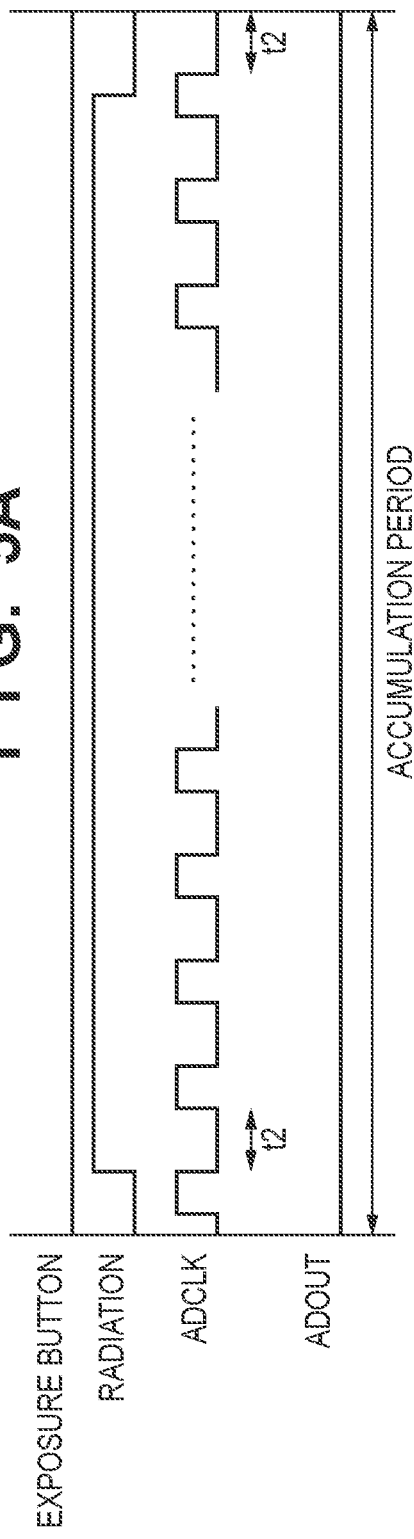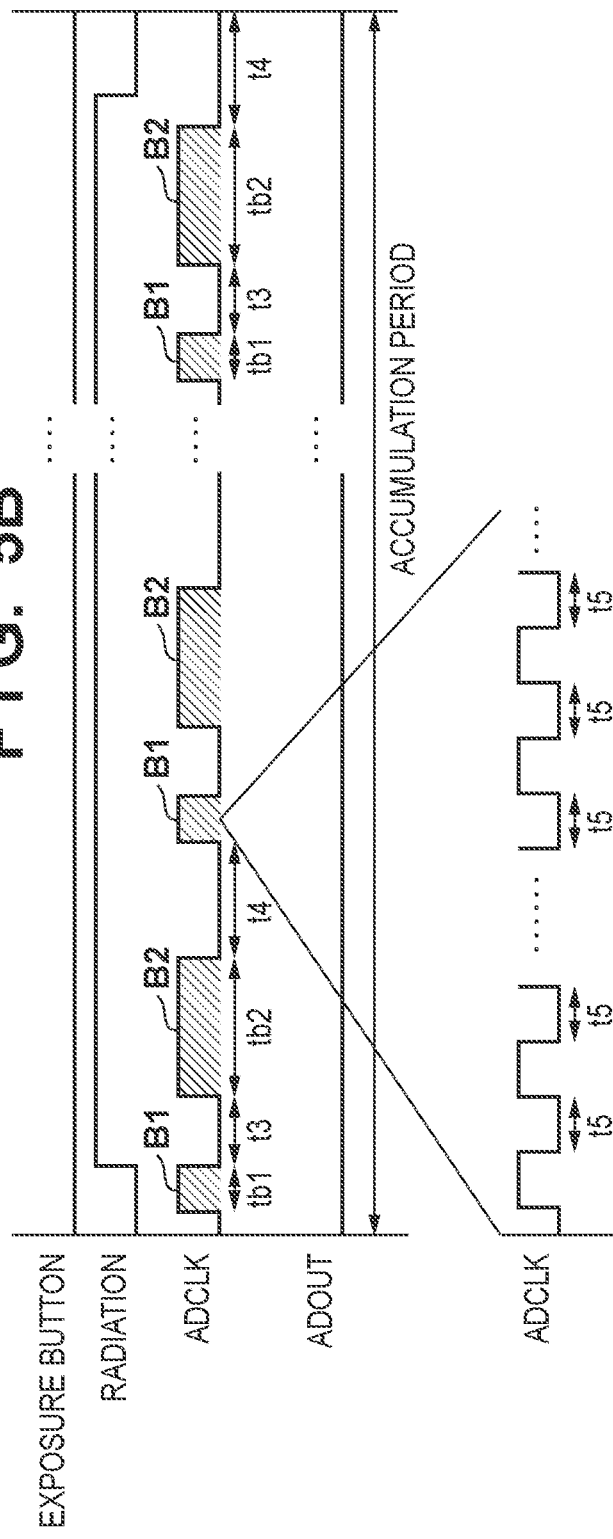

1

RADIATION IMAGING APPARATUS, RADIATION IMAGING SYSTEM, METHOD OF CONTROLLING RADIATION IMAGING APPARATUS, AND NON-TRANSITORY COMPUTER-READABLE STORAGE MEDIUM

BACKGROUND

Field of the Disclosure

The present disclosure relates to a radiation imaging apparatus, a radiation imaging system, a method of controlling the radiation imaging apparatus, and a non-transitory computer-readable storage medium.

Description of the Related Art

In medical image diagnosis and nondestructive inspection, a radiation imaging apparatus that uses a flat panel detector (FPD) made of a semiconductor material is widely used. Japanese Patent Laid-Open No. 2015-198263 discloses an imaging apparatus that includes a readout circuit including an integrating amplifier which integrates charges transferred from the pixels of an FPD, a sample-and-hold circuit which samples the output from the integrating amplifier, and an A/D conversion circuit which performs A/D conversion on each signal transferred from the sample-and-hold circuit. Japanese Patent Laid-Open No. 2011-101693 discloses that in order to reduce the influence of temperature drift from various kinds of circuits and components in a radiation image forming apparatus on a radiation image, power is supplied to a readout integrated circuit (IC) before the radiation image forming apparatus shifts from a sleep state to an imaging enabled state. Image quality degradation due to the influence of the temperature drift can be reduced by making the readout IC operate to increase the temperature of the readout IC to a predetermined temperature.

To reduce the influence of the temperature drift on a radiation image at the time of imaging, a readout circuit or the like may be operated in an accumulation period, for accumulating signals corresponding to the radiation that enters the FPD, in a manner similar to a readout period for reading out signals from an FPD. If the integrating amplifier and the A/D conversion circuit disclosed in Japanese Patent Laid-Open No. 2015-198263 are operated during the accumulation period, the output of the integrating amplifier may change due to noise caused by operating the readout circuit. If the change in the output of the integrating amplifier influences the signals to be read out from the pixels in the readout operation to be performed after the accumulation operation, the image quality of the radiation image to be obtained will degrade.

SUMMARY

Some embodiments of the present disclosure provide a technique advantageous in suppressing image quality degradation of a radiation image.

According to some embodiments, a radiation imaging apparatus comprises a pixel array on which a plurality of pixels each configured to accumulate a signal corresponding to radiation irradiation are arranged; a readout circuit configured to read out the signal from the pixel, wherein the readout circuit includes an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output, and the integrating amplifier includes an arrangement that can output a reference potential; and a controller configured to perform first control and second control in parallel in an accumulation period for accumulating the signal in the pixel array, wherein the controller performs control, in the first control, to make the A/D conversion circuit perform an analog/digital conversion operation, and wherein the controller controls, in the second control, the integrating amplifier and the sample-and-hold circuit so that the integrating amplifier outputs the reference potential and the A/D conversion circuit is electrically connected to a node configured to output the reference potential of the integrating amplifier, is provided.

According to some other embodiments, a method of controlling a radiation imaging apparatus comprising a pixel array on which a plurality of pixels each configured to accumulate a signal corresponding to radiation irradiation are arranged, and a readout circuit configured to read out the signal from the pixel, the readout circuit including an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output, and the integrating amplifier including an arrangement that can output a reference potential, the method comprising: performing first control and second control in parallel in an accumulation period for accumulating the signal in the pixel array; wherein in the first control, control is performed to make the A/D conversion circuit perform an analog/digital conversion operation, and wherein in the second control, the integrating amplifier and the sample-and-hold circuit are controlled so that the integrating amplifier outputs the reference potential and the A/D conversion circuit is electrically connected to a node configured to output the reference potential of the integrating amplifier, is provided.

According to still other embodiments, non-transitory computer-readable storage medium stores a program for causing a computer to execute a control method of a radiation imaging apparatus comprising a pixel array on which a plurality of pixels each configured to accumulate a signal corresponding to radiation irradiation are arranged, and a readout circuit configured to read out the signal from the pixel, the readout circuit including an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output, and the integrating amplifier including an arrangement that can output a reference potential, the method comprising: performing first control and second control in parallel in an accumulation period for accumulating the signal in the pixel array; wherein in the first control, control is performed to make the A/D conversion circuit perform an analog/digital conversion operation, and wherein in the second control, the integrating amplifier and the sample-and-hold circuit are controlled so that the integrating amplifier outputs the reference potential and the A/D conversion circuit is electrically connected to a node configured to output the reference potential of the integrating amplifier, is provided.

Further features of various embodiments will become apparent from the following description of exemplary embodiments (with reference to the attached drawings).

BRIEF DESCRIPTION OF THE DRAWINGS

FIGS. 5A and 5B are views for explaining an operation during an accumulation period of the radiation imaging apparatus according to FIG. 1.

DESCRIPTION OF THE EMBODIMENTS

Figure 1:
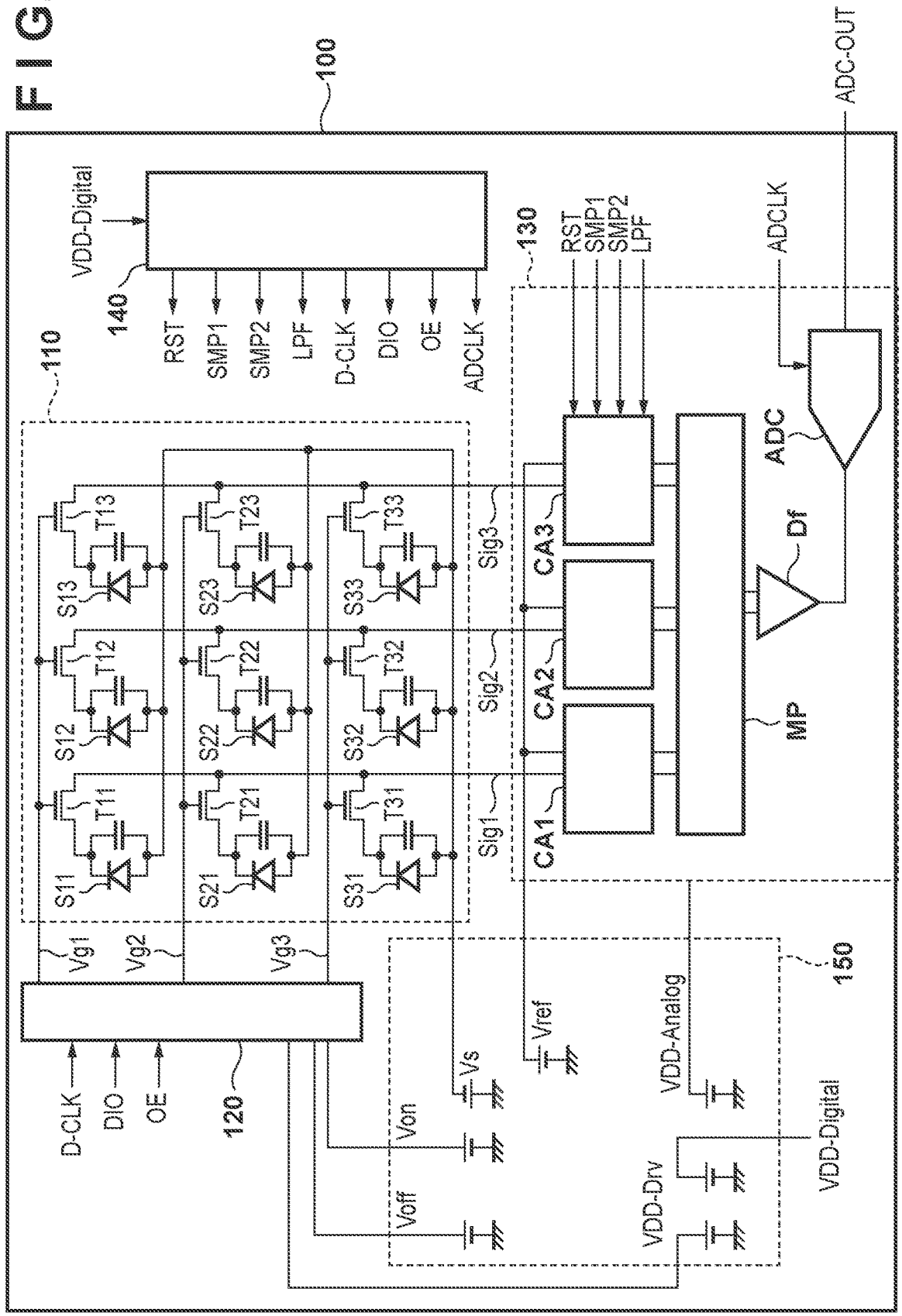
FIG. 1 is a block diagram showing an example of the arrangement of a radiation imaging apparatus according to an embodiment.

Hereinafter, embodiments will be described in detail with reference to the attached drawings. Note, the following embodiments are not intended to limit the scope of the claims. Multiple features are described in the embodiments, but some embodiments do not require all such features, and multiple such features may be combined as appropriate. Furthermore, in the attached drawings, the same reference numerals are given to the same or similar configurations, and redundant description thereof is omitted.

Radiation according to the present disclosure can include not only α-rays, β-rays, and γ-rays that are beams generated by particles (including photons) emitted by radioactive decay, but also beams having equal or more energy, for example, X-rays, particle rays, and cosmic rays.

A radiation imaging apparatus according to some embodiments will be described with reference to FIGS. 1 to 6. FIG. 1 is a block diagram showing an example of the arrangement of a radiation imaging apparatus 100. The radiation imaging apparatus 100 includes a pixel array 110 on which a plurality of pixels that accumulate signals corresponding to radiation irradiation are arranged, a readout circuit 130 which reads out signals from the pixel array 110, and a controller 140. The radiation imaging apparatus 100 also includes a power supply circuit 150 and a drive circuit 120 which drives the pixel array 110. The controller 140 supplies various kinds of control signals to the drive circuit 120 and the readout circuit 130 to control the operations of the drive circuit 120 and the readout circuit 130. The power supply circuit 150 supplies power to be used in the operations of the pixel array 110, the drive circuit 120, the readout circuit 130, and the controller 140.

The pixel array 110 includes a plurality of conversion elements S11 to S33 that convert incident radiation beams into electrical signals (charges) and a plurality of switch elements T11 to T33 that transfer the charges generated by the conversion elements to the readout circuit 130. For example, thin-film transistors (TFTs) or the like can be used as the switch elements T11 to T33. A single pixel is formed by combining one conversion element S and one switch element T, and a plurality of pixels are two-dimensionally arrayed on the pixel array 110. The pixel array 110 may also be referred to as an area sensor. Although 3 (rows)×3 (columns) of pixels are arranged in the pixel array 110 of the arrangement shown in FIG. 2, the arrangement of the pixels is not limited to this. A larger number of pixels can be arranged on the pixel array 110.

A bias voltage Vs is supplied from the power supply circuit 150 to one terminal of each of the conversion elements S1 to S33, and the other terminal of each of the conversion elements S11 to S33 is connected to a corresponding one of column signal lines Sig1 to Sig3 via the corresponding one of the switch elements T11 to T33.

A control signal is supplied from the drive circuit 120 to the gate of each of the switch elements T1 to T33 via a corresponding one of drive lines Vg1 to Vg3. Each of the switch elements T11 to T33 is switched on/off in accordance with the control signal supplied from the drive circuit 120. In a case in which the switch elements T11 to T33 are set to ON, charges accumulated in the conversion elements S11 to S33 are transferred to the column signal lines Sig1 to Sig3. In a case in which the switch elements T11 to T33 are set to OFF, charges will remain accumulated in the conversion elements S11 to S33.

The readout circuit 130 reads out the signals based on the charges transferred from the conversion elements S11 to S33 to the column signal lines Sig1 to Sig3. The readout circuit 130 includes column amplifiers CA1 to CA3 corresponding to the column signal lines Sig1 to Sig3, respectively, a multiplexer MP, a difference circuit Df, and an A/D conversion circuit ADC. The signals based on the charges transferred from the conversion elements S11 to S33 are read out by the column amplifiers CA1 to CA3 of the readout circuit 130. Each of the column amplifiers CA1 to CA3 converts the charges into a voltage and supplies the converted voltage to the multiplexer MP. The multiplexer MP sequentially supplies the signals, supplied from the column amplifiers CA1 to CA3, to the difference circuit Df. The difference circuit Df obtains a difference between two signals supplied from the multiplexer MP and supplies the obtained difference signal to the A/D conversion circuit ADC. The A/D conversion circuit ADC performs analog/digital conversion on the signal supplied from the difference circuit Df and outputs the signal.

Figure 2:
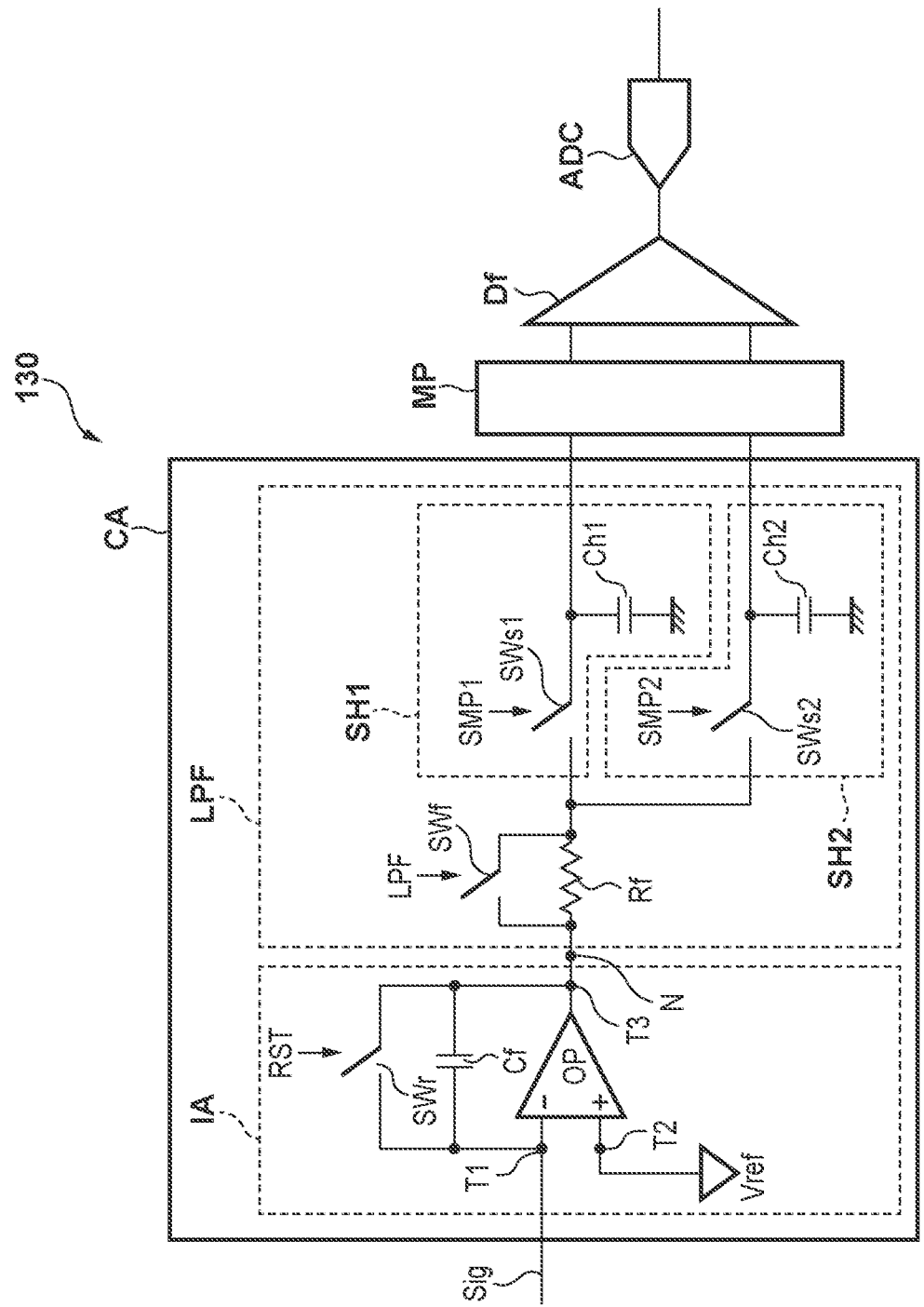
FIG. 2 is an equivalent circuit diagram showing an example of a column amplifier of the radiation imaging apparatus of FIG. 1.

The arrangement of each column amplifier CA of FIG. 1 will be described next with reference to an equivalent circuit diagram of FIG. 2. Although a single column amplifier CA is shown in FIG. 2, a plurality of column amplifiers CA are arranged in the readout circuit 130 as shown in FIG. 1. Each column amplifier CA includes an integrating amplifier IA which reads out signals from the pixels arranged on the pixel array 110 and a sample-and-hold circuit SH which samples the output from the integrating amplifier IA.

The integrating amplifier IA includes an operational amplifier OP, a capacitor Cf, and a switch SWr. The operational amplifier OP includes a terminal T1 which receives a signal which has been read out from a pixel, a terminal T2 to which a reference potential Vref is supplied, and an output terminal T3. The output terminal T3 is connected to a node N which is connected to the sample-and-hold circuit SH. The capacitor Cf is arranged between the terminal T1 and the output terminal T3. The switch SWr is arranged between the terminal T1 and the output terminal T3 to short-circuit the two terminals of the capacitor Cf.

The integrating amplifier IA accumulates the signals (signal charges) read out from pixels in the capacitor Cf, converts the accumulated charges into a voltage, and outputs the converted voltage. The gain of the integrating amplifier IA is determined by the capacitance value of the capacitor Cf. The ON/OFF setting of the switch SWr is controlled by a control signal RST supplied from the controller 140. If the switch SWr is set to ON, both terminals of the capacitor Cf are short-circuited, the voltages of both terminals of the capacitor Cf become equal to the reference potential Vref, and the charges accumulated in the capacitor Cf are reset. In this specification, an operation to reset the charges accumulated in the capacitor Cf will be referred to as resetting the integrating amplifier IA. It can also be said that the integrating amplifier IA is arranged to be able to output the reference potential Vref when the integrating amplifier IA is reset by setting the switch SWr to ON. In a case in which the switch SWr is set to OFF, charges are accumulated in the capacitor Cf in accordance with the charges transferred from the pixels.

In the arrangement shown in FIG. 2, the integrating amplifier IA includes one capacitor Cf. However, it may be arranged so that a capacitor to be selected to the operational amplifier OP can be selected by including a plurality of capacitors in the integrating amplifier IA. Such an arrangement will allow an appropriate gain to be set for each imaging technique in a case in which the radiation imaging apparatus 100 is to be used in accordance with a plurality of different imaging techniques with different imaging conditions.

The sample-and-hold circuit SH includes a switch SWs1 arranged between the output terminal T3 and the A/D conversion circuit ADC and a capacitor Ch1 which is connected between the switch SWs1 and the A/D conversion circuit ADC. The switch SWs1 and the capacitor Ch1 form a sample-and-hold circuit SH1. In this embodiment, the sample-and-hold circuit SH also includes a sample-and-hold circuit SH2 in addition to the sample-and-hold circuit SH1, and can perform correlated double sampling (CDS). The sample-and-hold circuit SH2 includes a switch SWs2, which is arranged between the output terminal T3 and the A/D conversion circuit ADC in parallel to the switch SWs1, and a capacitor Ch2, which is connected between the switch SWs2 and the A/D conversion circuit ADC. The capacitance values of the capacitor Ch1 and the capacitor Ch2 are equal to each other.

In the arrangement shown in FIG. 2, the readout circuit 130 further includes a resistive element Rf arranged between the output terminal T3 and the sample-and-hold circuit SH. The resistive element Rf and the capacitors Ch1 and Ch2 of the sample-and-hold circuit SH form a low-pass tilter LPF. The output from the integrating amplifier IA is supplied from the low-pass filter LPF. The low-pass filter LPF removes a high-frequency component from the output from the integrating amplifier. The readout circuit 130 further includes a switch SWf which is arranged between the output terminal T3 and the sample-and-hold circuit SH and in parallel to the resistive element Rf.

The ON/OFF setting of the switch SWs1 is controlled by a control signal SMP1 supplied from the controller 140. In a case in which the switch SWs1 is set to ON, the resistive element Rf and the capacitor Ch1 are connected, and a low-pass filter is formed by the resistive element Rf and the capacitor Ch1. In a case in which the switch SWs1 is set to OFF, the output of this low-pass filter is held by the capacitor Ch1.

In a similar manner, the ON/OFF setting of the switch SWs2 is controlled by a control signal SMP2 supplied from the controller 140. In a case in which the switch SWs2 is set to ON, the resistive element Rf and the capacitor Ch2 are connected, and a low-pass filter is formed by the resistive element Rf and the capacitor Ch2. In a case in which the switch SWs2 is set to OFF, the output of this low-pass filter is held by the capacitor Ch2.

The ON/OFF setting of the switch SWf is controlled by a control signal LPF supplied from the controller 140. In a case in which the switch SWf is set to ON, both terminals of the resistive element Rf are short-circuited. In a case in which the switch SWf is set to OFF, both terminals of the resistive element Rf are not short-circuited. The time constant of the low-pass filter LPF is changed by switching the ON/OFF setting of the switch SWf.

For example, consider a case in which the switch SWs1 is set to OFF and the switch SWs2 is set to ON to form a low-pass filter based on the resistive element Rf and the capacitor Ch2.

In this case, a time constant τ1 of the low-pass filter LPF when the switch SWf is set to ON can be expressed as follows:

$$\tau 1 = \{ron \times rf/(ron + rf)\} \times ch2,$$

where rf is a resistance value of the resistive element Rf, ch2 is a capacitance value of the capacitor Ch2, and ron is an ON resistance value when the switch SWf is set to ON. In this case, if ron <<rf, τ1 is approximated as follows:

$$\tau 1 \approx ron \times ch2.$$

On the other hand, a time constant τ2 of the low-pass filter LPF when the switch SWf is set to OFF can be provided as follows:

$$\tau 2 = rf \times ch2.$$

For example, in a case in which rf=50 kΩ and ron=5 kΩ, τ2/τ1≈10000. That is, the time constant τ1 of the low-pass filter formed by the ON resistance of the switch SWf and the capacitors Ch1 and Ch2 will be smaller than the time constant τ2 of the low-pass filter formed by the resistive element Rf and the capacitors Ch1 and Ch2. In this manner, the time constant of the low-pass filter LPF is variable in this embodiment.

Although one low-pass filter LPF is formed by two sample-and-hold circuits SH1 and SH2 in the arrangement shown in FIG. 2, a separate resistive element may be connected to each of the sample-and-hold circuit SH1 and the sample-and-hold circuit SH2 so as to form separate low-pass filters. Also, although the sample-and-hold circuits SH1 and SH2 form a part of the low-pass filter LPF in the arrangement shown in FIG. 2, the low-pass tilter LPF and the sample-and-hold circuits SH1 and SH2 may be formed by separate circuit elements. In addition, the low-pass filter LPF (the resistive element Rf) may not be arranged. Furthermore, in a case in which correlated double sampling need not be performed, the sample-and-hold circuit SH may be formed by only the sample-and-hold circuit SH.

An example of the operation of the radiation imaging apparatus 100 will be described next with reference to the timing charts of FIGS. 3A to 3D. In FIGS. 3A to 3D, "radiation" indicates the presence/absence of the radiation to be emitted on the radiation imaging apparatus 100. Reference symbols RST, LPF, SMP1, and SMP2 indicate control signals to be supplied from the controller 140 to the switches SWr, SWf, SWs1, and SWs2, respectively. Reference symbols Vg1 to Vg3 indicate control signals that flow through the drive lines Vg1 to Vg3, respectively. Reference symbol ADCLK indicates a clock signal supplied to the A/D conversion circuit ADC. Reference symbol ADOUT indicates an output from the A/D conversion circuit ADC.

In an accumulation period for accumulating signals in the pixel array 110, the controller 140 maintains the control signals, which are to be supplied to the drive lines Vg1 to Vg3, at low level. Thus, the switch elements T11 to T33 remain in an OFF state. In this period, a radiation exposure operation is permitted, and radiation irradiation is performed. As a result, charges corresponding to the radiation transmitted through an object are accumulated in the conversion elements S11 to S33.

Upon completion of the accumulation period, it shifts to a readout period for reading out the signals from the pixel array. The controller 140 reads out the charges accumulated in the conversion elements S11 to S33. First, the controller 140 switches the control signal RST to high level to set the switch SWr to ON. As a result, the integrating amplifier IA is reset. After the integrating amplifier IA has been reset, the controller 140 switches the control signal SMP1 to high level to set the switch SWs1 to ON. As a result, a low-pass filter is formed by the resistive element Rf and the capacitor Ch1, and the sample-and-hold circuit SH1 starts to sample the output of the integrating amplifier IA through this low-pass filter. Subsequently, the controller 140 switches the control signal SMP1 to low level to set the switch SWs1 to OFF. As a result, the sample-and-hold circuit SH1 ends the sampling operation, and the output of the low-pass filter LPF at this point of time is held by the capacitor Ch1.

Next, the controller 140 switches the control signal to be supplied to the drive lines Vg1 to high level to set the switch elements T11 to T13 to ON. As a result, the charges accumulated in each of the conversion elements S11 to S13 are read out by the corresponding one of the column amplifiers CA1 to CA3 and are held in the integrating amplifier IA of each column amplifier.

Next, the controller 140 switches the control signal SMP2 to high level to set the switch SWs2 to ON. As a result, a low-pass filter is formed by the resistive element Rf and the capacitor Ch2, and the sample-and-hold circuit SH2 starts to sample the output of the integrating amplifier IA through this low-pass filter. At the start timing of the sampling operation, the controller 140 switches the control signal LPF to high level to set the switch SWf to ON. As a result, a time constant τ of the low-pass filter LPF is decreased, and enough time for charging the capacitor Ch2 can be ensured.

After a predetermined time has elapsed, the controller 140 continues the sampling operation by switching the control signal LPF to low level to set the switch SWf to OFF. Subsequently, the controller 140 switches the control signal SMP2 to low level to set the switch SWs2 to OFF. As a result, the sample-and-hold circuit SH2 ends the sampling operation, and the output from the low-pass filter LPF at this point of time will be held in the capacitor Ch2.

At this point in time, the capacitor Ch1 will hold the output from the integrating amplifier IA obtained before the pixel signal readout operation, and the capacitor Ch2 will hold the output from the integrating amplifier IA obtained during the pixel signal readout operation. Subsequently, an output difference between a signal sampled and held by the capacitor Ch1 and a signal sampled and held by the capacitor Ch2 is output as a pixel signal from the difference circuit Df to the A/D conversion circuit ADC. That is, the difference circuit Df will execute correlated double sampling. The execution of the correlated double sampling will remove a low-frequency noise component from the output of the integrating amplifier IA. Also, the above-described low-pass filter LPF will remove a high-frequency noise component from the output of the integrating amplifier IA. Subsequently, similar processing will be performed on pixels connected to the drive lines Vg2 and Vg3.

The radiation imaging apparatus 100 may repeatedly perform, regardless of the presence/absence of a radiation exposure operation, the above-described operation of the accumulation period and the above-described operation of the readout period at a predetermined cycle. In addition, in a case in which radiation exposure is performed, the operation of the accumulation period may shift to the operation of the readout period in accordance with the completion of the exposure operation.

Here, as shown in FIGS. 3A to 3D, in order to maintain uniform power consumption during the operation period of the radiation imaging apparatus 100, control is performed so that the control signal ADCLK will be supplied to cause the A/D conversion circuit ADC to execute an analog/digital conversion operation even in the accumulation period. That is, the controller 140 will control the readout circuit 130 so that the power consumption during the accumulation period will be equal to the power consumption during the readout period in which signals are readout from the pixel array 110. At this time, the controller 140 may perform control so that the A/D conversion circuit ADC will execute an analog/digital conversion operation. As a result, temperature fluctuation in the pixel array 110, the readout circuit 130, and the like during the accumulation period and the readout period can be suppressed, and output during continuous imaging or the like can be stabilized. Although details are not shown in FIGS. 3A to 3D, control may be performed so that the A/D conversion circuit ADC will perform the same operation or perform different operations in the accumulation period and the readout period.

Figure 4A:
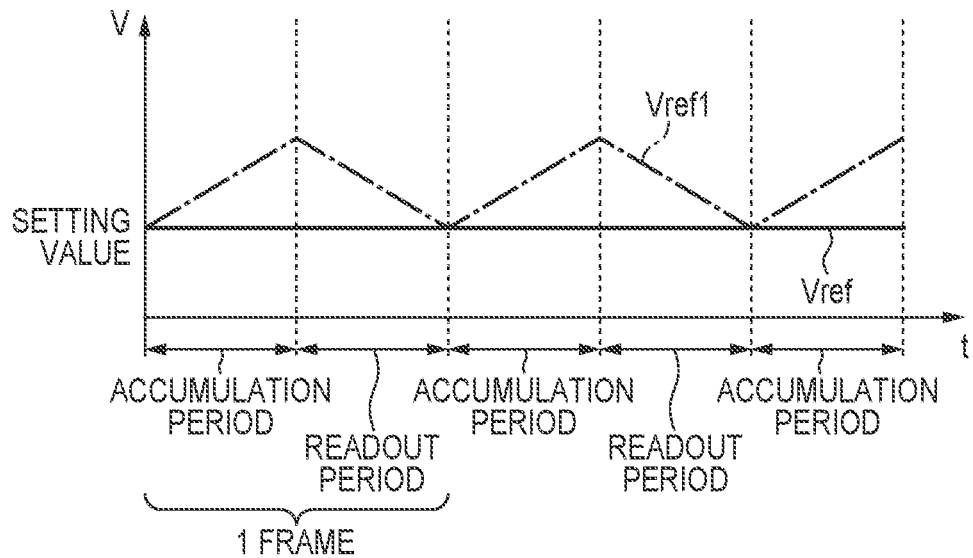
FIGS. 4A and 4B are views for explaining an issue of the operation of the radiation imaging apparatus of FIG. 1.

Control of the column amplifiers CA required to be performed in a case in which the control signal ADCLK is to be supplied to make the A/D conversion circuit ADC to operate even in the accumulation period in this manner will be described. A comparative example will be described first. When the A/D conversion circuit ADC is continuously operated to maintain the power consumption in the accumulation period in the radiation imaging apparatus 100, the output within the image became non-uniform due to the fluctuation of the reference potential Vref of the integrating amplifier IA in the analog circuit in some cases. More specifically, the reference potential Vref sometimes fluctuated in cases in which the A/D conversion circuit ADC was not electrically connected to the node N that outputs the reference potential Vref of the integrating amplifier IA. As shown in FIG. 4A, the reference potential Vref of the integrating amplifier IA fluctuates in the accumulation period, and the fluctuated reference potential Vref fluctuates so as to return to the setting value in the readout period.

If the operation of the readout period is performed in a state in which the reference potential Vref has fluctuated as shown in FIG. 4A, the width of the fluctuation of the reference potential Vref may change depending on the timing. Assume that a reference potential Vref1 shown in FIG. 4B indicates the fluctuation of the reference potential Vref when a radiation image F1 is obtained, and that a reference potential Vref2 shown in FIG. 4B indicates the fluctuation of the reference potential Vref when a radiation image F2 is obtained. In this case, the output of the integrating amplifier IA will fluctuate ("OP1" of FIG. 4B in the case of the reference potential Vref and "OP2" of FIG. 4B in the case of the reference potential Vref2) in accordance with the difference between the reference potential Vref1 and the reference potential Vref2. If offset correction is performed on the radiation image F1 and the radiation image F2 obtained in such a state, in-plane shading will occur, in accordance with the difference between OP1 and OP2, on the image which has undergone the offset correction.

In this embodiment, the controller 140 performs the control to be described below to suppress image quality degradation such as the in-plane shading and the like. The controller 140 performs control to make the A/D conversion circuit ADC to continuously operate to suppress temperature fluctuation during the accumulation period. In parallel to performing control to make the A/D conversion circuit ADC operate, the controller 140 switches the control signal RST to high level to set the switch SWr in a conductive state. As a result, the integrating amplifier IA is reset, and the reference potential Vref is supplied to the node N. Furthermore, the controller 140 switches the control signal SMP1 to high level to set the switch SWs1 in a conductive state. In a similar manner, the controller 140 switches the control signal SMP2 to high level to set the switch SWs2 in a conductive state.

In this manner, the controller 140 controls the integrating amplifier IA and the sample-and-hold circuit SH1 so that the integrating amplifier IA outputs the reference potential Vref and the A/D conversion circuit ADC is electrically connected to the node N which is to output the reference potential Vref of the integrating amplifier IA. By controlling the operation of each column amplifier CA and electrically connecting the components within the readout circuit 130, the potential within the readout circuit 130 will hardly be influenced by noise caused by the operation of the A/D conversion circuit. As a result, the fluctuation of the reference potential Vref of the operational amplifier OP can be suppressed even if the control signal ADCLK is supplied to make the A/D conversion circuit ADC operate continuously in the accumulation period.

Figure 3A:
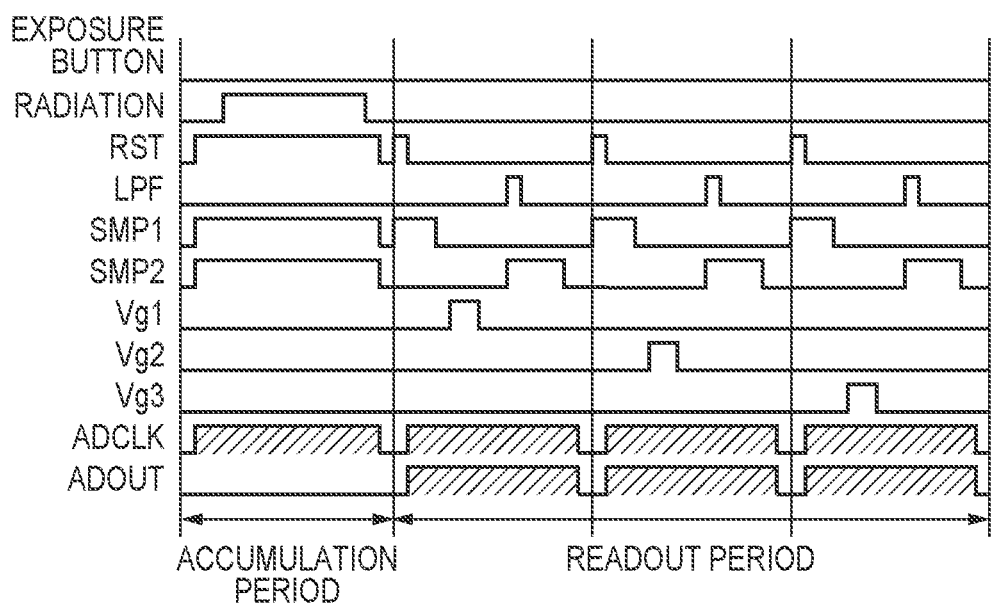
FIGS. 3A to 3D are timing charts for explaining an example of the operation of the radiation imaging apparatus of FIG. 1.
Figure 3B:
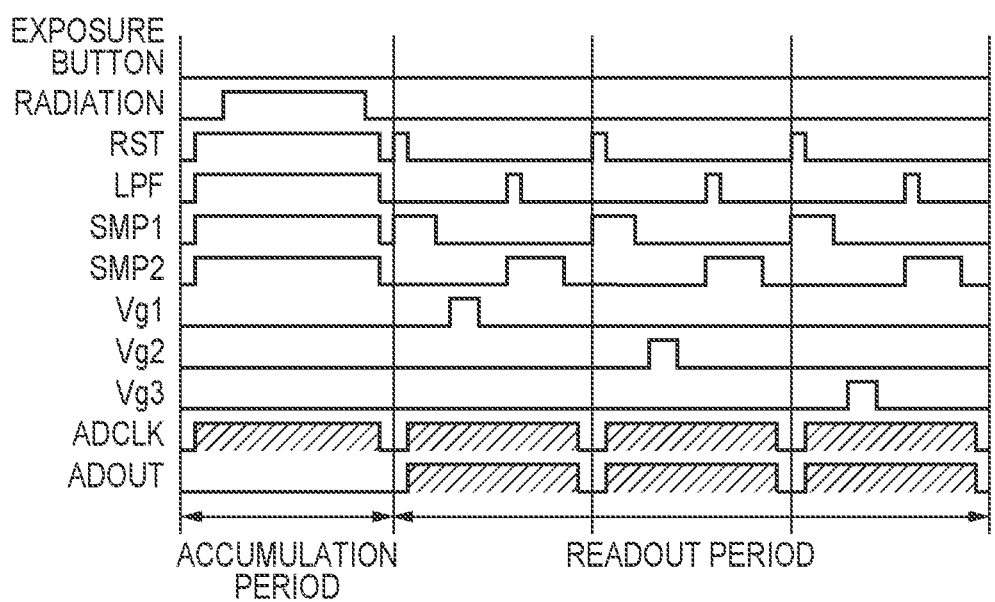
Figure 3C:
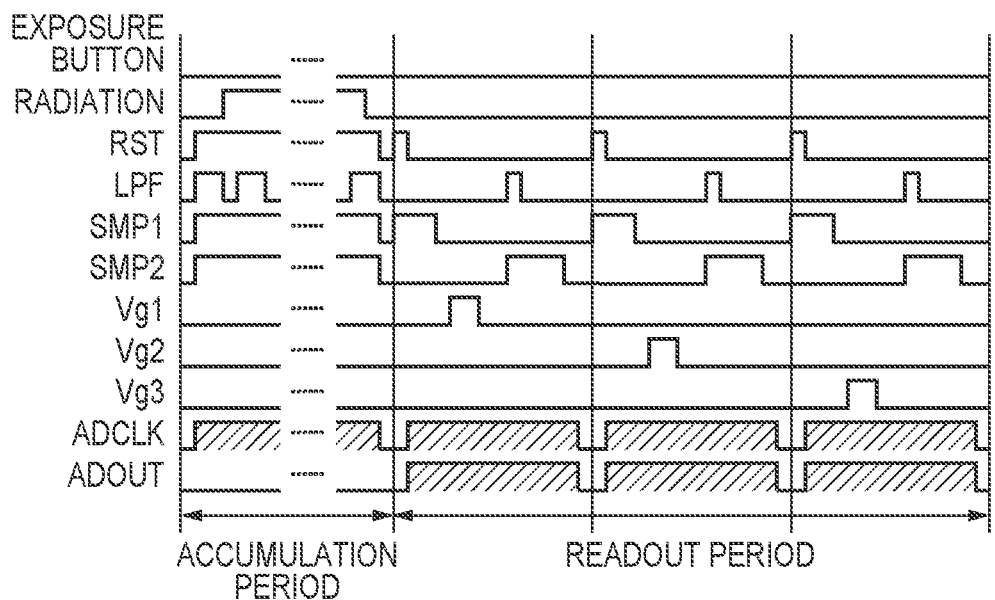

As shown in FIG. 3B, the controller 140 may switch the control signal LPF to set the switch SWf to ON. As a result, the input impedance viewed from the multiplexer MP will further decrease, and a more stable operation can be expected with respect to the fluctuation of the reference potential Vref. At this time, the controller 140 may execute control so that the switch SWf becomes conductive at the same timing as the switch SWr, the switch SWs1, and the switch SWs2. Also, as shown in FIG. 3C, the controller 140 may also alternately switch the control signal LPF between low level and high level to set the switch SWf in the conductive state intermittently. In this case, the duty ratio of the OFF period and the ON period may be set to any value.

Figure 3D:
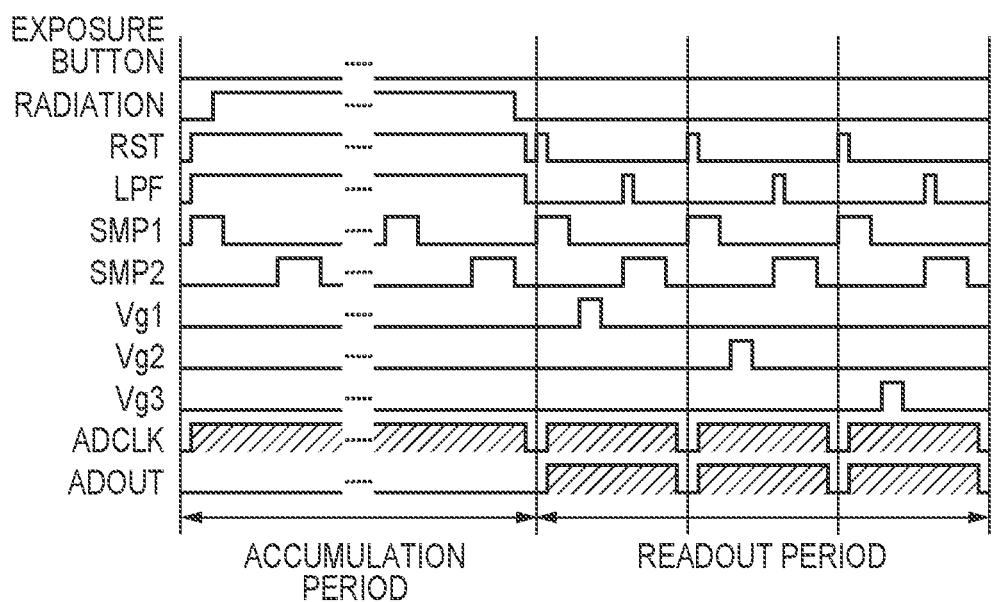
Figure 4B:
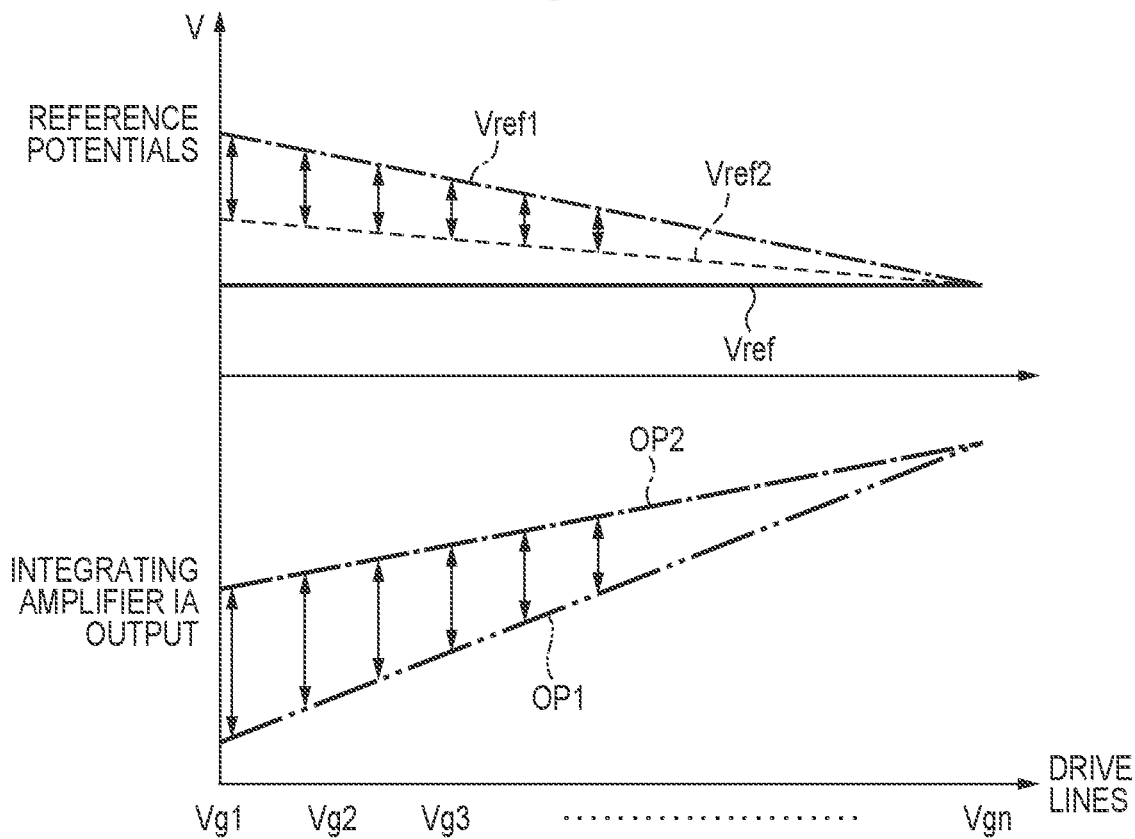

As shown in FIGS. 4A and 4B, the controller 140 may perform control so that the switch SWr, the switch SWs1, and the switch SWs2 become conductive at the same timing. However, some embodiments are not limited to this. The controller 140 need not always perform control to set the control signals SMP1 and SMP2 to high level in the accumulation period, and may switch the switches SWs1 and SWs2 ON/OFF within a range in which the reference potential Vref will not fluctuate. For example, as shown in FIG. 3D, the controller 140 may switch the switches SWs1 and SWs2 ON/OFF by controlling the control signals SMP1 and SMP2 in a manner similar to the operation of the readout period. That is, the controller 140 may perform control so that the switch SWs1 and the switch SWs2 become conductive at different timings in the accumulation period.

Upon shifting the accumulation period to the readout period, the controller 140 first stops supplying the control signal ADCLK and stops controlling the column amplifiers CA required for the operation of the accumulation period. Next, the controller 140 shifts the operation to the operation of the readout period.

Also, in the accumulation period, the controller 140 need not always control the column amplifiers CA. The fluctuation of the reference potential Vref can be effectively suppressed by just controlling each column amplifier CA in a suitable period before the completion of the accumulation period. The suitable period which requires each column amplifier CA to be controlled in the accumulation period can be appropriately determined in accordance with the fluctuation amount of the reference potential Vref and the period in which the control signal ADCLK is supplied. In addition, although FIGS. 3A to 3D show examples in which both the switch SWs1 and the switch SWs2 are set in a conductive state, it may be arranged so that only one of the switches becomes conductive. It is sufficient as long as the reference potential Vref is output from the integrating amplifier IA and the A/D conversion circuit ADC is electrically connected to the node N which is to output the reference potential Vref of the integrating amplifier IA.

Another method of suppressing the fluctuation of the reference potential Vref output by the integrating amplifier IA will be described with reference to FIGS. 5A and 5B.

As shown in FIG. 5A, the controller 140 supplies the control signal ADCLK intermittently at a predetermined interval in the accumulation period. Assume here that a mute period is a period in which the control signal ADCLK is temporarily paused. The fluctuation of the reference potential Vref can be suppressed regardless of the control performed on each column amplifier CA by appropriately setting a period t2 in this mute period. More specifically, assume that a period t1 is the length of the mute period of the control signal ADCLK when the operation of each column amplifier CA is to be controlled in the above-described manner. In this case, the fluctuation of the reference potential Vref can be suppressed by setting the period t2 to be longer than the period t1 (t1<t2).

In addition, the control signal ADCLK need not always be supplied at a predetermined interval in the accumulation period. As shown in FIG. 5B, the fluctuation of the reference potential Vref can be suppressed by arranging, after a period (a burst period B) in which the control signal ADCLK is supplied intermittently, a pause period in which the control signal ADCLK is not supplied intermittently. This operation can be used in combination of the control operation of the column amplifiers CA described above.

As shown in FIG. 5B, assume that a period t5 is the length of the mute period during the burst period. In addition, a period tb1 is the length of a burst period B1, and a period t3 is the length of a suitable pause period corresponding to the burst period B1. In a similar manner, a period tb2 is the length of a burst period B2, and a period t4 is the length of the suitable pause period corresponding to the burst period B2. Here, in a case in which the period tb2 of the burst period B2 is longer than the period tb1 of the burst period B1, the period t4 of the pause period is longer than the period t3. In addition, the periods t3 and t4 of the pause period are longer than the period t5 of the mute period of the burst period B. That is, the periods can have the following relationship:

$$tb1 < tb2 \Rightarrow t5 < t3 \leq t4.$$

FIG. 5B is merely an example, and each period in the burst period B as well as the corresponding pause period can be set appropriately. In addition, the mute period in the burst period B may be the same for each burst period or may be set differently for each burst period. However, if the control signal ADCLK is supplied at a predetermined interval in the manner shown in FIG. 5A, a suitable mute period (the period t2 of FIG. 5A) needs to be arranged before the operation process enters the readout period. In addition, if the control signal ADCLK will not be supplied at a predetermined interval in the manner shown in FIG. 5B, a suitable pause period (the period t4 of FIG. 5B) needs to be arranged before the operation process enters the readout period.

Figure 6:
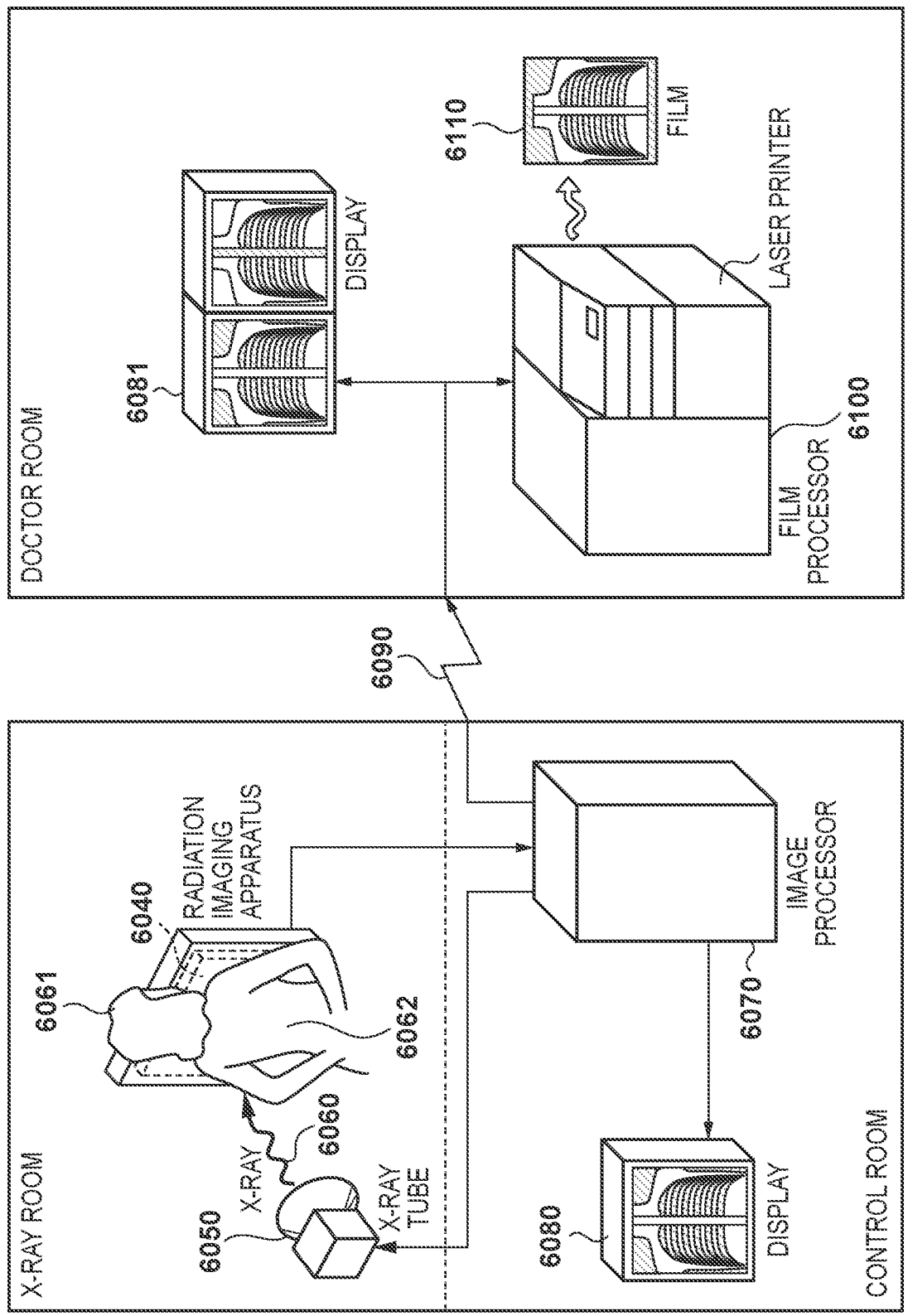
FIG. 6 is a view showing an example of the arrangement of a radiation imaging system using the radiation imaging apparatus of FIG. 1.

A radiation imaging system incorporating the radiation imaging apparatus 100 will be exemplified next with reference to FIG. 6. X-rays 6060 generated by an X-ray tube 6050, serving as a radiation source for emitting radiation to a radiation imaging apparatus 6040 (corresponding to the above-described radiation imaging apparatus 100), pass through a chest 6062 of a patient or object 6061 and enter the radiation imaging apparatus 6040. The incident X-rays include the internal body information of the patient or object 6061. In the radiation imaging apparatus 6040, a scintillator emits light in correspondence the entry of the X-rays 6060, and the emitted light is photoelectrically converted by photoelectric conversion elements to obtain electrical information. This electrical information is converted into digital data, undergoes image processing by an image processor 6070 serving as a signal processing unit, and can be observed on a display 6080 serving as a display unit in a control room.

Also, this information can be transferred to a remote place by a transmission processing unit, such as a network 6090, which may be, for example, a telephone, a LAN, the Internet, or the like. This allows the information to be displayed on a display 6081 serving as a display unit in a doctor's office or the like in another place, and allows a doctor who is in a remote place to make a diagnosis. In addition, the information can be saved on a recording medium, such as an optical disk, and a film processor 6100 can also record the information on a film 6110 serving as a recording medium.

Other Embodiments

Some embodiment(s) can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2020-004669, which was filed on Jan. 15, 2020 and which is hereby incorporated by reference herein in its entirety.

What is claimed is:

1. A radiation imaging apparatus comprising:
a pixel array on which a plurality of pixels each configured to accumulate a signal corresponding to radiation irradiation are arranged;
a readout circuit configured to read out the signal from a pixel of the plurality of pixels, wherein the readout circuit includes an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output; and
a controller configured to perform first control and second control in parallel in an accumulation period for accumulating the signal in the pixel array,
wherein the integrating amplifier includes: an operational amplifier including a first terminal to which the signal is transferred from the pixel, a second terminal to which a reference potential is supplied, and an output terminal connected to a first node; a first capacitor which is arranged between the first terminal and the output terminal; and a first switch which is arranged between the first terminal and the output terminal so as to short-circuit two terminals of the first capacitor,
wherein the sample-and-hold circuit includes: a second switch which is arranged between the output terminal and the A/D conversion circuit; and a second capacitor having a terminal connected to a second node between the second switch and the A/D conversion circuit,
wherein the controller performs control, in the first control, to make the A/D conversion circuit perform an analog/digital conversion operation, and
wherein the controller controls, in the second control, the integrating amplifier to continuously output the reference potential during a period at least from a timing before start of the radiation irradiation to a timing after completion of the radiation irradiation in the accumulation period by making the first switch conductive while electrically connecting the A/D conversion circuit to the first node to which the reference potential is output by making the second switch conductive.

2. The apparatus according to claim 1, wherein the sample-and-hold circuit further includes a third switch which is arranged between the output terminal and the A/D conversion circuit and in parallel to the second switch and a third capacitor which is connected between the third switch and the A/D conversion circuit, and
the controller performs control so that the third switch becomes conductive in the accumulation period.

3. The apparatus according to claim 2, wherein the readout circuit further includes, between the sample-and-hold circuit and the A/D conversion circuit, a multiplexer and a difference circuit configured to output a difference between a signal sampled and held by the second capacitor and a signal sampled and held by the third capacitor.

4. The apparatus according to claim 2, wherein the controller performs control so that the first switch, the second switch, and the third switch become conductive at the same timing in the accumulation period.

5. The apparatus according to claim 2, wherein the controller performs control so that the second switch and the third switch become conductive at different timings in the accumulation period.

6. The apparatus according to claim 1, wherein the readout circuit further includes a resistive element which is arranged between the output terminal and the sample-and-hold circuit.

7. The apparatus according to claim 6, wherein the readout circuit further includes a fourth switch which is arranged between the output terminal and the sample-and-hold circuit and in parallel to the resistive element, and the controller performs control so that the fourth switch becomes conductive in the accumulation period.

8. The apparatus according to claim 7, wherein the controller performs control so that the fourth switch and the first switch become conductive at the same timing in the accumulation period.

9. The apparatus according to claim 7, wherein the controller performs control so that the fourth switch becomes conductive intermittently in the accumulation period.

10. The apparatus according to claim 9, wherein a time constant of a low-pass filter which is formed by the second capacitor and an ON resistance of the fourth switch is smaller than a time constant of a low-pass filter which is formed by the resistive element and the second capacitor.

11. The apparatus according to claim 1, wherein the controller controls the readout circuit so that power consumption in the accumulation period is equal to power consumption in a readout period for reading out the signal from the pixel array.

12. The apparatus according to claim 11, wherein the controller performs control to cause the A/D conversion circuit to perform analog/digital conversion in the accumulation period so that the power consumption in the accumulation period is equal to the power consumption in the readout period.

13. A radiation imaging system comprising:
a radiation imaging apparatus defined in claim 1; and
a signal processing unit configured to process a signal from the radiation imaging apparatus.

14. A method of controlling a radiation imaging apparatus comprising a pixel array on which a plurality of pixels each configured to accumulate a signal corresponding to radiation irradiation are arranged, and a readout circuit configured to read out the signal from a pixel of the plurality of pixels,
the readout circuit including an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output, and
the integrating amplifier including: an operational amplifier including a first terminal to which the signal is transferred from the pixel, a second terminal to which a reference potential is supplied, and an output terminal connected to a first node; a first capacitor which is arranged between the first terminal and the output terminal; and a first switch which is arranged between the first terminal and the output terminal so as to short-circuit two terminals of the first capacitor, and
the sample-and-hold circuit including: a second switch which is arranged between the output terminal and the A/D conversion circuit; and a second capacitor having a terminal connected to a second node between the second switch and the A/D conversion circuit, the method comprising:
performing first control and second control in parallel in an accumulation period for accumulating the signal in the pixel array;
wherein in the first control, control is performed to make the A/D conversion circuit perform an analog/digital conversion operation, and
wherein in the second control, the integrating amplifier continuously outputs the reference potential during a period at least from a timing before start of the radiation irradiation to a timing after completion of the radiation irradiation in the accumulation period by conducting the first switch while electrically connecting the A/D conversion circuit to the first node to which the reference potential is output by conducting the second switch.

15. A non-transitory computer-readable storage medium storing a program for causing a computer to execute a control method of a radiation imaging apparatus comprising a pixel array on which a plurality of pixels each configured to accumulate a signal corresponding to radiation irradiation are arranged, and a readout circuit configured to read out the signal from a pixel of the plurality of pixels,
the readout circuit including an integrating amplifier configured to read out the signal from the pixel, a sample-and-hold circuit configured to sample an output from the integrating amplifier, and an A/D conversion circuit configured to perform analog/digital conversion on an output from the sample-and-hold circuit and output the converted output, and
the integrating amplifier including: an operational amplifier including a first terminal to which the signal is transferred from the pixel, a second terminal to which a reference potential is supplied, and an output terminal connected to a first node; a first capacitor which is arranged between the first terminal and the output terminal; and a first switch which is arranged between the first terminal and the output terminal so as to short-circuit two terminals of the first capacitor, and
the sample-and-hold circuit including: a second switch which is arranged between the output terminal and the A/D conversion circuit; and a second capacitor having a terminal connected to a second node between the second switch and the A/D conversion circuit, the method comprising:
performing first control and second control in parallel in an accumulation period for accumulating the signal in the pixel array;
wherein in the first control, control is performed to make the A/D conversion circuit perform an analog/digital conversion operation, and
wherein in the second control, the integrating amplifier continuously outputs the reference potential during a period at least from a timing before start of the radiation irradiation to a timing after completion of the radiation irradiation in the accumulation period by conducting the first switch while electrically connecting the A/D conversion circuit to the first node to which the reference potential is output by conducting the second switch.

\* \* \* \* \*